United States Patent [19]

Itatani et al.

[11] Patent Number: 5,737,082
[45] Date of Patent: Apr. 7, 1998

[54] METHOD OF ELECTRO-OPTICAL MEASUREMENT FOR VECTOR COMPONENTS OF ELECTRIC FIELDS AND AN APPARATUS THEREOF

[75] Inventors: Taro Itatani; Tadashi Nakagawa; Yoshinobu Sugiyama, all of Tsukuba; Kimihiro Ohta, Kashiwa, all of Japan

[73] Assignee: NTT Mobile Communications Network, Inc., Japan

[21] Appl. No.: 506,385

[22] Filed: Jul. 24, 1995

[30] Foreign Application Priority Data

Nov. 28, 1994 [JP] Japan .................. 6-291884

[51] Int. Cl.$^6$ .................................... G01J 4/00
[52] U.S. Cl. .......................... 356/364; 356/365
[58] Field of Search .......................... 356/364–370; 350/392–395, 356, 371, 377; 370/1–4; 324/77, 96, 95

[56] References Cited

U.S. PATENT DOCUMENTS

| | | | |
|---|---|---|---|
| 3,556,662 | 1/1971 | Levenstein et al. | 350/114 |
| 3,614,451 | 10/1971 | Gunn | 250/217 |
| 3,623,814 | 11/1971 | Buhrer | 356/114 |
| 3,771,874 | 11/1973 | Sadjian | 356/43 |
| 3,902,805 | 9/1975 | Redner | 356/33 |
| 4,053,763 | 10/1977 | Harney | 250/206 |
| 4,353,650 | 10/1982 | Sommargren | 356/371 |
| 4,446,425 | 5/1984 | Valdmanis et al. | 324/77 |
| 4,603,293 | 7/1986 | Mourou et al. | 324/96 |
| 4,681,449 | 7/1987 | Bloom et al. | 356/364 |
| 4,758,006 | 7/1988 | Heinrich et al. | 356/364 |
| 4,875,006 | 10/1989 | Henley et al. | 324/158 |
| 4,904,931 | 2/1990 | Miller | 324/96 |
| 4,983,911 | 1/1991 | Henley | 324/158 |
| 5,097,201 | 3/1992 | Henley | 324/96 |
| 5,124,635 | 6/1992 | Henley | 324/96 |
| 5,170,127 | 12/1992 | Henley | 324/658 |
| 5,471,306 | 11/1995 | Yui et al. | 356/367 |

FOREIGN PATENT DOCUMENTS 6-291884  11/1994  Japan .

OTHER PUBLICATIONS

Itatani et al., Measurement of Longitudinal Electric Field on Coplaner Transmission Lines by Electrooptic Sampling, Aug. 23, 1994, pp. 214–216.
"A Method of Measuring Electric And An Apparatus Thereof", IEICE TRNS. ELCTRON., vol. 1, 73–80, Jan. 1995.

*Primary Examiner*—Frank G. Font
*Assistant Examiner*—Michael P. Stafira
*Attorney, Agent, or Firm*—George P. Hoare, Jr.; Rogers & Wells

[57] ABSTRACT

An apparatus of measuring an electric signal comprises a laser device, optical elements, an electrooptic crystal, a photoelectric converter, and an electric circuit. The electrooptic crystal is selected from the materials in the type of having properties of changing its refractive index in the direction of its optic major axes and the direction of these axes by a function of an applied electric field. In the apparatus, the electrooptic crystal is placed in the electric field applied by an electric circuit under measurement. A laser beam emitted from the laser device is incident on the electrooptic crystal. A reflected light passed through the crystal is resolved into rays in two polarized direction. Each ray is subjected to a photoelectric conversion by passing through the photoelectric converter and exerted as an electric output. A differential signal of the electric output is defined as a measurement signal. By selecting two polarized directions of the laser beam by a half-wave plate as the optical element, two signals corresponding to the changes in the refractive index and optic major axes of the crystal. Two component of a vector of the electric field can be obtained by a first order combination of these signals.

13 Claims, 8 Drawing Sheets

METHOD OF ELECTRO-OPTICAL MEASUREMENT FOR VECTOR COMPONENTS OF ELECTRIC FIELDS AND AN APPARATUS THEREOF

BACKGROUND OF THE INVENTION

1. Field of the Invention

The present invention relates to a method generally termed as an electrooptic sampling method, for measuring components of an electric field applied on an electrooptic crystal by using change in optical characteristics thereof in the presence of the electric field. Also, the present invention relates to an apparatus using such method.

2. Description of the Related Art

At first, a conventional electrooptic sampling method will be explained in the following description.

FIG. 1 is a schematic representation of an arrangement of devices in accordance with the conventional electrooptic sampling method. In the figure, reference numeral 1 denotes an electric circuit under measurement on which an electrooptic crystal plate 2 is deposited. Above a surface of the crystal plate 2, a light source 3 and a detector 5 are appropriately positioned in space.

In general, a pulse-laser device is used as the above light source 3. Because it is preferable to use a pulsed light beam as an incident light 4 for instantly measuring an electric signal that changes at a high speed.

In general, furthermore, the incident light 4 can be selected from linearly-, elliptically-, and circulaly-polarized light beams. In the conventional example, however, the linearly polarized light beam is used as the incident light 4 for more simplified configuration.

As shown in FIG. 1, the laser beam 4 is emitted from the laser source 3 in the direction almost perpendicular to the crystal's surface. The laser beam 4 is incident on the crystal plate 2 and reflected from a bottom thereof. Then the transmitted light is propagated into a detector 5 where the laser beam 4 is converted into an electric signal as an output.

In this type of the arrangement, as described above, the laser beam 4 is not emitted strictly in the direction perpendicular to the crystal's surface. In this arrangement, however, the extent of errors of the measurement to be occurred can be reduced enough.

If it is possible or desirable to utilize an electrooptic effect of a substrate having the electric circuit 1 in stead of using the electrooptic crystal plate 2, the laser beam 4 may be introduced into a portion to be measured through the side or backside of the substrate.

In the arrangement shown in FIG. 1, the incident light propagating through the crystal plate 2 is controlled so as to have a chronically stable polarized condition.

For realizing the constant polarized condition with highest reliability, as shown in FIG. 2, the laser beam 4 should be modulated into a linearly polarized condition by passing through an appropriate polarizer 6 and then modulated into an elliptical polarized condition or a circularly polarized condition by passing through an appropriate phase compensator 14.

When a predetermined level of voltage is applied on the electric circuit 1, an electric field is generated around the circuit. In this case, a part of its field lines passes through the electrooptic crystal plate 2 to generate another electric field inside the crystal plate 2. By applying the electric field, the electrooptic crystal plate 2 changes its refractive index of the light passing therethrough. Therefore, it is possible to determine a magnitude of the electric field in the electrooptic crystal plate 2 and a magnitude of the applied voltage thereon.

As the electric field is generated only in proximity to the electric circuit on the electrooptic crystal plate 2, only a small part (typically from 1 μm to several 10 μm in length) of an optical path of the laser beam 4 is able to interact with the electric field when the above conventional method is used for measuring a voltage at a point on an extremely small electric circuit. Accordingly, the conventional system using the arrangement as shown in FIG. 2 has been applied in the conventional measurement because the electrooptic effect is very small and the degree of a phase shift of the reflected light is also very small.

FIG. 2 is another schematic representation of the arrangement of devices for explaining the principle of the measurement in detail. In this figure, a laser beam 4 is illustrated so as to propagate through an electrooptic crystal plate 7. That is, the laser beam 4 passes the crystal plate 7 that has a double thickness compared with that of the crystal plate 2 in FIG. 1 in which the laser beam 4 is reflected by the bottom surface thereof to return.

In FIG. 2, one of optic major axes (i.e., one of optically defined coordinate axes: x, y, and z) is parallel to the laser beam 4, while remaining two other axes are perpendicular to the laser beam 4. Hereinafter, we define X as an axis parallel to an incident direction of the laser beam 4.

In FIG. 2, (a), (b), (c), and (d) express polarized conditions of the laser beam 4 at several points on a path of propagating the laser beam 4 through the arrangement.

The polarization of the laser beam 4 at the point of reference numeral 8 is shown in (a). In this case, after passing through a polarizer 6, the laser beam 4 is propagated as an incident light not parallel to the axes Y and Z. In general, a path of the laser beam 4 is oriented in a such way that it is incident on a plane at the angle of 45° with respect to the axes Y and Z. However, the incident angle of the laser beam is not limited to 45° but also it is possible to use another angle so as to enoughly incorporate polarized components in the directions of the axes Y and Z. In the following description, the direction of polarizing the laser beam 4 is oriented at the angle of 45° with respect to the directions of the optic major axes.

The laser beam 4 passed through the electrooptic crystal plate 7 generates a phase difference between two polarized components of the axes Y and Z. The phase difference is based on two faces in which one depends on a birefringence of the electrooptic crystal plate 7 and the other depends on the difference between changes in refractive index of the crystal plate 7 in the directions of the axes Y and Z when an electric field is applied on the crystal plate 7.

In (b) of FIG. 2, reference numeral 11 denotes the polarized condition of the laser beam 4 at a point of reference numeral 10 in the absence of the electric field. In (c), on the other hand, numeral reference 12 denotes the polarized condition of the laser beam 4 at a point of reference numeral 10 in the presence of the electric field. In the case of the polarized condition 11, it is in the mode of an elliptical polarization because of the phase difference between two polarized components caused by the birefringence of the electrooptic crystal plate 7. In the case of polarized condition 12, on the other hand, it is in the mode of another elliptical polarization different from that of the condition 11 because of adding another phase difference caused by an electrooptic effect on the phase difference in the polarized condition 11. Actually, the difference between the polarized conditions 11 and 12 may be extremely small.

After passing through the polarizer 6 and the electrooptic crystal plate 7, the laser beam 4 reaches at a detector 13. The detector 13 comprises a phase compensator 14, a birefringent prism 15, and two photoelectric conversion elements 16, 17. The phase compensator 14 is provided as an optical element responsible for proving a further phase difference between the polarized components of the axes Y and Z. It is noted that the phase compensator 14 is able to regulate a degree of the phase difference.

Polarized conditions of the laser beam that passed through the phase compensator 14 are indicated in (d) and (e) of FIG. 2. That is, (d) shows the polarized condition 18 in the absence of electric field while (e) shows another polarized condition 19 in the presence of electric field. In these cases, the phase compensator 14 can be controlled so as to form a circular polarization of the laser beam 4 in the absence of the electric field while the polarized condition 19 is provided as an unperfected elliptical polarization almost like a circular one.

After passing through the phase compensator 14, the laser beam 4 reaches at the birefringent prism 15. The birefringent prism 15 has functions of resolving the incident light into two polarized components along two optic major axes to be determined by the prism 15; and ejecting each of the polarized components by propagating through their own path ways different from each other. In FIG. 2, furthermore, (f) shows two different optic major axes 20 and 21 of the prism 15 used in the arrangement. That is, the incident light can be resolved into two polarized components parallel to the axes 20 and 21, respectively by passing through the prism 15. Then the decomposed rays reach at the photoelectric converters 16, 17 which is responsible to convert each ray into an electric signal. If, for example, photodiodes are used as these photoelectric converters 16 and 17, an electric current proportional to the strength of the incident light can be produced as an output of electric signal.

When the laser beam 4 is in the condition of the circular polarization 18 as shown in (d) of FIG. 2, the photoelectric converters 16 and 17 receive rays with the same strength, resulting that they generate the same level of photoelectric current. In the case of FIG. 2 (e), on the other hand, the photoelectric converters 16 and 17 receive rays with different strengths respectively, resulting that they generate different levels of photoelectric current. Therefore, the electric signals proportional to the change in polarized condition of the laser beam can be obtained by supplying outputs of the above photoelectric converters 16, 17 into an electric circuit 22 in the type of detecting the difference between these outputs.

In an actual measurement, by the way, it is difficult to make a coincidence between the levels of output currents (i.e., strengths of photoelectric conversions) to be generated by introducing a stable incident light into the photoelectric converters 16, 17. As shown in (e) of FIG. 2, therefore, the polarized condition 18 is slightly shifted from the circular polarization by adjusting the phase compensator 14 to generate the same levels of photoelectric current from the photoelectric converters 16, 17 when the light beam with the polarized condition 18 is resolved by the prism 15. In this case, furthermore, the polarized condition 19 is different from the polarized condition 18, so that an electric signal 23 can be obtained in proportion to the change in the polarized condition that depends on the electric field.

The conventional arrangement described above, in general, can be used for measuring the level of voltage between two points in the electric circuit 1 under measurement. In such measurement, to put it concretely, the measurement includes the steps of disposing the electrooptic crystal plate 7 and the laser beam 4 in their appropriate positions between the two points in the electric circuit 1; applying a voltage of 0 V for between the above two points to adjust the phase compensator 14 to generate no electric signal from the electric circuit 22; and applying a voltage of predetermined level to measure the electric signal 23 for determining the proportional relationship between the measured voltage and the electric signal 23, prior to the actual measurement.

In addition, the process includes the further steps of selecting an appropriate component of electric-field's vector generated by applying the voltage between the above two points; and determining a type of the electrooptic crystal plate 7 and an arrangement of the optic major axes so as to obtain the maximum phase difference of the light passing through the electrooptic crystal plate 7 with respect to the selected component of the electric field. Under such determined condition, frequently, the phase difference is also effected by another component of the electric-field's vector but this do not cause any difficulty as far as the interest is to measure the voltage between the above two points.

The above measurement may be also used in the process of measuring each component of the electric-field's vector. This kind of the measurement is very important because the electric-field's vector fluctuates complexly when the electric signal fluctuates in an extremely short period, so that the electric-field's vector can be only detected by the measurement on an experimental basis.

For the purpose of measuring one component of the electric-field's vector very precisely, the process may include the steps of selecting a type of the electrooptic crystal plate 7 and positioning the optic major axes so that the crystal plate 7 does not have sensitivities with respect to other components of the electric-field's vector and abilities to propagate the laser beam 4 with the phase difference with respect to the electrooptic effect.

For measuring a plurality of components of the electric-field's vector, the process may include the step of measuring each component at its appropriate crystal's position. In the case of measuring the electric field components in two directions in a surface of the electric circuit, for example, the process includes the step of measuring one component in one direction and then turning the direction of the electrooptic crystal an an angle of 90° to measure another component in another direction (Itatani et al., Technical Report of IEICE, ED93-70, 87. 1993).

However, when the type of the electrooptic crystal and its optic major axes are determined so as to sense only one of the electric field components, the measurement has a disadvantage of utilizing a component that has a small electrooptic coefficient. For example, among the electrooptic crystals used in the conventional measurement, $C_{3v}$-type crystals (i.e., crystals in the shape of ditrigonal pyramid) such as LiNbO$_3$ and LiTaO$_3$ (i.e., ferroelectric perovskite crystals) have the most large electrooptic coefficient with their refractive indices as indicated by the following formula (1).

$$n_x = n_o + \frac{1}{2} r_{22} E_y - \frac{1}{2} r_{13} E_z \qquad (1)$$

-continued $$n_y = n_o + \frac{1}{2} r_{22}E_y - \frac{1}{2} r_{13}E_z,$$

$$n_z = n_e + \frac{1}{2} r_{33}E_z$$

wherein x, y, and z denote optic major axes in which these axes are provided as a right-handed coordinate system in which the z axis is defined as an optic axis along which a light beam is propagated; $n_o$ denotes a refractive index of an ordinary ray; $n_e$ denotes a refractive index of an extraordinary ray; $n_x$, $n_y$, and $n_z$ denote refractive indices of polarized light beams in the directions of x, y, and z axes, respectively, in the presence of an outside electric field; $E_y$ and $E_z$ are components of the electric field to be applied from the outside in the directions of y and z axes, respectively; and $r_{22}$, $r_{13}$, and $r_{33}$ denote electrooptic coefficients (Pockels constants).

In Table 1, the electrooptic coefficients of $LiNbO_3$ and $LiTaO_3$, which take the largest values compared with that of the other $C_{3V}$-type crystals, are shown. Also, the electrooptic coefficient $r_{33}$ is larger than the other electrooptic coefficients $r_{22}$ and $r_{13}$. It is noted that these facts have been well known in general for the $C_{3V}$-type crystals.

TABLE 1

Electrooptic coefficients of the different types of crystals ("Kessyo Kogaku" published by Morikawa shuppan, Co., Ltd.)

| Materials | Types | Electrooptic coefficients (pm/V) |
|---|---|---|
| $LiNbO_3$ | $C_{3V}$ | $r_{13} = 8.6$, $r_{22} = 3.4$, $r_{33} = 30.8$, $r_{51} = 28$ |
| $LiTaO_3$ | $C_{3V}$ | $r_{13} = 7.9$, $r_{22} = 1$, $r_{33} = 35.8$, $r_{51} = 20$ |
| ZnS | $C_{5V}$ | $r_{13} = 0.92$, $r_{22} = 1.85$ |
| GaAs | $T_d$ | $r_{41} = 1.2$ |
| ZnTe | $T_d$ | $r_{41} = 4.3$ |

In the conventional electrooptic sampling method, the laser beam is incident on the electrooptic crystal in the direction of x or y axis perpendicular to the optical axis z for utilizing the maximum electrooptic coefficient $r_{33}$. In the case of emitting the laser beam along the x axis, the incident laser beam is modified so as to have equal polarized components of y and z axes, respectively. At this time, the phase-change can be indicated like the above formula (I). That is, the phase-change for the polarized component in the direction of the y axis is proportional to the formula:

$$n_y = n_o - \frac{1}{2} r_{22}E_y - \frac{1}{2} r_{13}E_z$$

While the phase-change for the polarized component in the direction of the z axis is proportional to the formula:

$$n_z = n_e - \frac{1}{2} r_{33}E_z$$

Therefore, the comparative difference between their phase-changes has a constant term of $n_e - n_o$. Also, the changed components are proportional to $r_{22}E_y + (r_{13} - r_{33})E_z$. The resultants of the measurement includes influences of the electric field components $E_y$ and $E_z$ in two different directions. To put it concretely, the influence of the $E_y$ is included as a sensitivity of the crystal in proportion to the electrooptic coefficient $r_{22}$, while the $E_z$ is included as a sensitivity of the crystal in proportion to the electrooptic coefficient $r_{33}$.

For the measurement with respect to the incident laser beam in the direction of the y axis, a calculation can be also performed in a similar way as stated above. In this case, the measurement results in including the influences of the electric field components $E_y$ and $E_z$ in two different directions.

In each case of the measurements for the axes x and y, it cannot obtain the result in proportion to only one component of the electric-field's vector. For the measurement with respect to only one direction, there is an idea of repeating the measurement two times by rotating the electrooptic crystal at an angle of 90° so as to obtain two different results at one point. In this case, each result is obtained as an extent of the different contributions of $E_y$ and $E_z$. In principle, therefore, it may be possible no obtain the measurement's result in proportion to one component of the electric-field's vector by performing an arithmetic operation on the values of $E_y$ and $E_z$. However, such operation is of no practical use because of a remarkable decrease in a precision of the measurement.

For equalizing the measurement sensitivities of the crystal orientations in the above two measurements, the distance between the electrooptic crystal and the electric circuit under measurement should be kept at constant before and after the rotation of the crystal. In a practical manner, however, the above distance takes a small value of approximately 1 μm. Thus the strength of the electric field can be extremely fluctuated in spite of a slightly change of the distance.

Consequently, it is difficult to insure a reliability of the measurement when the arithmetic operation is performed under the condition that the ratio of the above sensitivities remains to be accounted for. It means that the conventional measurement method including the seep of obtaining a maximum sensitivity of the measurement cannot measure one electric field component in one direction alone.

To solve this problem, there is another conventional method including the steps of providing an incident laser beam in the direction of the axis z and adjusting the incident light so as to equalize the polarized component along the axis x and the polarized component along the axis y. In this case, as in the same way of the formula 1, the phase-change is proportionate to the formula:

$$n_x = n_o + \frac{1}{2} r_{22}E_y - \frac{1}{2} r_{13}E_z$$

with respect to the polarized component in the x-axis direction, while the phase-change is proportionate to the formula $$n_y = n_o - \frac{1}{2} r_{22}E_y - \frac{1}{2} r_{13}E_z$$

with respect to the polarized component in the y-axis direction. Therefore, the measurement's result proportionate to the relative difference of their phase-changes is in proportion to $n_x - n_y$. The measurement's result is obtained as an output proportionate only to the electric field's component $E_y$ in one direction.

For the purpose of measuring the electric field components in two directions perpendicular to each other, the electrooptic crystal may be rotated at an angle of 90° at the period of between the first and second measurements. In this case, the electric field component in one direction is determined by the first measurement, so that the precise measurement can be performed when the process of calibrating the measurement's sensitivity is provided. In general, however, there is a few chance of existence of both calibrations with respect to two directions perpendicular to each other, so that it is hard to precisely obtain the ratio of the magnitudes among the components of the electric-field's vector. In this case, furthermore, the measurement's sensitivity is proportionate to the electrooptic coefficient $r_{22}$. However, the $r_{22}$ is smaller than the $r_{33}$, so that there is a problem of an extraordinary degradation of the measurement's sensitivity compared with that of the measurement method in which the incident light is introduced along the axes x and y.

Furthermore, other types of the electrooptic crystals have been used in the conventional measurement methods. For example, GaAs or the like in the type of $T_d$ (i.e., hexterahedron) and ZnS or the like in the type of $C_{6V}$ (i.e., dihexagonal pyramid), which are different from the type of $C_{3V}$. In these types, the materials have their own electrooptic coefficients as listed in Table 1. That is, each material has its electrooptic coefficient differ from the maximum $r_{33}$ of the $C_{3V}$-typed crystal by an order or orders of magnitude, resulting that an improvement of the measurement's sensitivity cannot be attained.

SUMMARY OF THE INVENTION

The purpose of the present invention is to provide methods of measuring electric signals by using an electrooptic sampling process and apparatuses using such methods, in which electric field components in the different directions can be measured without mechanically changing the position of an electrooptic crystal without decreasing its reproducibility and accuracy of the measurement.

In a first aspect of the present invention, there is provided a method of measuring an electric signal by a detection of a potential deference between two points in an electric circuit or an electric field generated by the electric circuit, in which variations in optical characteristics of an electrooptic crystal adjacent to the electric circuit are used for the detection, the method comprising steps of:

introducing an optical pulse having a predetermined polarized condition as an incident light into the electrooptic crystal in a direction parallel to one of optic major axes of the electrooptic crystal under a condition that an electric field is not applied on the electrooptic crystal;

modulating the predetermined polarized condition of the incident light into two different polarized conditions by passing the incident light through a half-wave plate and a polarizer without mechanically displacing the electrooptic crystal;

converting optical outputs from the electrooptic crystal into electric signals with respect to the two different polarized conditions, respectively;

measuring magnitudes of the electric signals, respectively; and determining two of three components of a vector of the electric field in the electrooptic crystal by performing an arithmetic operation on results of the measurement.

The electrooptic crystal may be in a type of changing a direction of the optic major axes in a presence of the electric field in the electrooptic crystal; and a direction of introducing the incident light into the electrooptic crystal is defined as a direction without corresponding to a rotation axis of an optical indicatrix, wherein the step of measuring magnitudes of the electric signals with respect to the two different polarized conditions, comprising sub-steps of:

providing a polarized condition of the incident light as a linear polarization;

modifying one of the two different polarized conditions into a polarized condition parallel to one of the optic major axes without the electric field in the electrooptic crystal; and measuring magnitudes of the electric signals under by using variations in the polarized condition of the incident light in a presence of the electric field in the electrooptic crystal.

The electrooptic crystal may be in a type of causing a change in refractive indexes thereof by an electrooptic effect and changing a direction of the optic major axes by the electrooptic effect; and a direction of introducing the incident light into the electrooptic crystal is defined as a direction without corresponding to a optic axis of the electrooptic crystal wherein the step of measuring magnitudes of the electric signals with respect to the two different polarized conditions comprising sub-steps of:

modifying one of the two differerent polarized conditions into a polarized condition parallel to one of the optic major axes without the electric field in the electrooptic crystal; and measuring magnitudes of the electric signals under by using variations in the polarized condition of the incident light in a presence of the electric field in the electrooptic crystal.

The electrooptic crystal may be made of a material selected from $C_{3V}$-type crystals, preferably of $LiNbO_3$ or $LiTaO_3$.

In a second aspect of the present invention, there is provided an apparatus for measuring an electric signal by a detection of a potential deference between two points in an electric circuit or an electric field generated by the electric circuit, in which variations in optical characteristics of an electrooptic crystal adjacent to the electric circuit are used for the detection, the apparatus comprising:

a device for introducing an optical pulse having a predetermined polarized condition as an incident light into the electrooptic crystal in a direction parallel to one of optic major axes of the electrooptic crystal under a condition that an electric field is not applied on the electrooptic crystal;

a device having a halfwave plate and a polarizer for modulating the predetermined polarized condition of the incident light into two different polarized conditions by passing the incident light without mechanically displacing the electrooptic crystal;

a device for converting optical outputs from the electrooptic crystal into electric signals with respect to the two different polarized conditions, respectively;

a device for measuring magnitudes of the electric signals, respectively; and a device for determining two of three components of a vector of the electric field in the electrooptic crystal by performing an arithmetic operation on outputs of the device for measuring magnitudes of the electric signals.

The device for converting optical output from the electrooptic crystal into electric signals may have a phase compensate plate for adjustably compensating a phase of an output light emitting from the electrooptic crystal under a phase modulation;

a birefringent prism for converting a change of the phase of the output light into a change of strength thereof; and a photoelectric converter for performing a photoelectric conversion of an output light from the birefringent prism.

The electrooptic crystal may be made of a material selected from $C_{3V}$-type crystals, preferably of $LiNbO_3$ or $LiTaO_3$.

The device for modulating the predetermined polarized condition of the incident light may perform two measurements: a first measurement where the incident light is incident on the electrooptic crystal under a condition of inclining the polarized direction of the incident light at an angle of 45° with respect to a crystal axis of the electrooptic crystal; and a second measurement where the incident light is incident on the electrooptic crystal under a condition that the polarized direction of the incident light is parallel to the crystal axis of the electrooptic crystal, and a device for determining two of three components of the vector of the electric field in the electrooptic crystal performs a compensation for obtaining a correct waveform of the electric signals for one of two components of the vector subtracting a component originated from a component in a propagating direction of the electric field from a waveform obtained by introducing the incident light at the angle of 45° into the electrooptic crystal.

The half-wave plate may be adjusted so as to obtain a maximum output from the polarizer and the phase compensate plate is adjusted so as to obtain a maximum sensitivity of an output light therefrom against the component in the propagating direction of the electric field without any sensitivity thereof against components in a traverse direction of the electric field.

The above and other objects, effects, features and advantages of the present invention will become more apparent from the following description of embodiments thereof taken in conjunction with accompanying drawings.

DETAILED DESCRIPTION OF PREFERRED EMBODIMENTS

Figure 1:
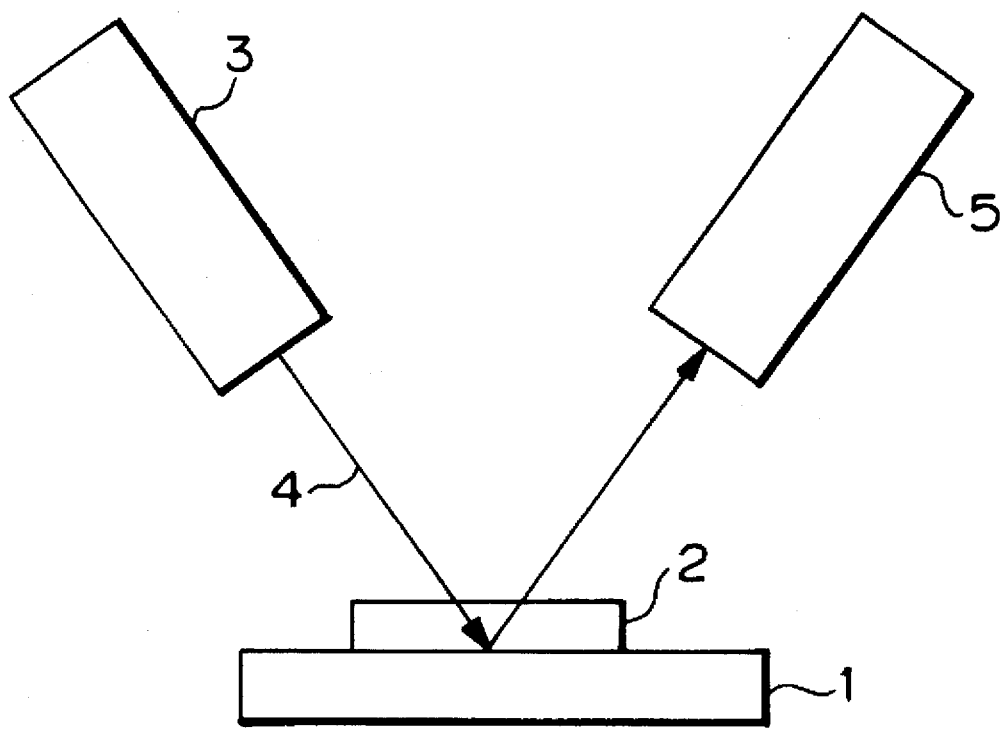
FIG. 1 is a schematic illustration of an arrangement of devices for explaining a principle of the measurement in accordance with a conventional electrooptic sampling process.

A function and a measuring principle of an apparatus used for measuring an electric signal in accordance with the present invention will be now described in detail.

In the present invention, the process of measuring an electric signal includes the seeps of measuring two components of an applied electric-field's vector in two directions perpendicular to each other by performing an arithmetic operation between two different outputs. That is, the first output is proportionate to the change in a refractive index of an electrooptic crystal under measurement and the second output is proportionate to the change in optic major axes of an optical indicatrix to be caused by a function of an electrooptic effect.

In the above process, the change in the optic major axes of the optical indicatrix can be measured as an output proportionate to a component of the electric-field's vector to be defined by the relative arrangement of the electrooptic crystal and a laser beam incident thereon. On the other hand, by the way, the output corresponding to the change in the refractive index by a function of the conventional electrooptic effect is provided as an overlap of a signal corresponding to the change in the refractive index by the above-mentioned electric-field's component, and a signal corresponding to the change in the refractive index by another electric-field's component perpendicular to the former electric-field's component corresponding to the change in the refractive index by another electric-field's component perpendicular to the former.

Then the obtained outputs of the above measurement of the present invention are further processed by subjecting them in the arithmetic operation to determine the electric field components in two directions perpendicular to each other. The step of determining these components can be performed under the condition that the electrooptic crystal is being fixed at the predetermined position. In this case, therefore, there are no change in the ratio between the sensitivities of the measurement procedures. Therefore, the method including two measurement procedures is extremely more useful than the conventional one because of a precise measurement of the electric field components in two directions perpendicular to each other by performing the arithmetic operation of finding the difference between the obtained results of the above measurement procedures.

Hereinafter, we will explain a $C_{3V}$-type electrooptic crystal as one of the crystals that exerts an electrooptic effect for causing the change in optic major axes of an optical indicatrix. The optical indicatrix is defined as a three dimensional ellipsoid whose surface is limited by vectors in which each one is elongated from an origin with a length proportional to a refractive index of the crystal in that direction.

In general, a refractive index of light against an anisometric material having properties that differ according to the refractive index is described as an optical indicatrix in a space. The refractive index of an incident light in the predetermined direction can be described by an ellipse formed by slicing the ellipsoid by a plane perpendicular to the direction of the incident light. The plane includes a center of the above ellipsoid.

Hereinafter, the case that the incident laser beam is provided along the axis x will be explained. In this case, the following formula (2) expresses the ellipse. It is noted that the similar calculation can be applied to result in similar effects when the incident laser beam is provided in the direction of the axis y.

$$\left(\frac{1}{n_o^2} + r_{22}E_y + r_{13}E_z\right)y^2 + \left(\frac{1}{n_e^2} + r_{33}E_z\right)z^2 + 2r_{51}E_y yz = 1 \quad (2)$$

Accordingly, the optic axes are defined by the principle axes of this ellipse. Also, the above formula (1) expressing the change in the refractive index can be led from first and second members of the equation (2). In accordance with a third member of the equation (2), however, the optic major axes shift their directions from one to another in the presence of the electric field $E_y$. That is, the direction of each optic major axis (hereinafter, also referred as a major-axis direction) in the presence of the electric field Ey is different from the previous one in the absence thereof. The change in the major-axis directions are proportionate to $r_{51}E_y$. In this case, however, the change in the directions are extremely small, for example less than 1 mrad, so that such change is disregarded with respect to the change in refractive index in the major-axis directions. Furthermore, the relative phase-difference between two polarized axis in the direction of y axes and z axes, is proportionate to a difference of the major-axis directions is proportionate to a difference of the refractive indexes (ny–nz) to be caused by the electric field, so that the phase-change is proportionate to $r_{22}E_y+(r_{13}-r_{33})E_z$ in accordance with the equation (1).

As listed in Table 1, the electrooptic coefficient $r_{51}$ of the $C_{3V}$-type electrooptic crystal takes almost the same value as the electrooptic coefficient $r_{33}$, so that their sensitivities are almost the same with respect to the electric field components in both measurement procedures. Accordingly, two electric field components $E_x$ and $E_y$, which are perpendicular to each other, can be obtained by performing the arithmetic operation of finding the difference between the results of the measurement procedures with respect to the change in the optic major axes and the change in the difference of refractive indexes.

In the above described measurement procedures in accordance with the present invention, the precision of each measurement procedure can be improved to the level to be determined by the precision of adjusting the measurement's sensitivity. Furthermore, the degree of rational precision between measured values of two electric fields is almost the same as that of the precision of determining the electrooptic coefficient, resulting that, there is no uncertain factors, for example an indeterminateness of the distance between the electrooptic crystal and the electric circuit under measurement, which are introduced by measuring methods.

A method of measuring change in the optic major axes will be explained in the following description.

There are several methods of measuring the change in the optic major axes of the optical indicatrix, for example, a direct measurement using an interference with a reference laser beam that does not pass through the electrooptic crystal; a measurement in the major-axis directions by changing the direction of polarization of an incident laser beam; and a measurement in which an effect of the change in the major-axis directions is replaced with a phase variation of the light by using a birefringence of the electrooptic crystal itself.

In the today's optical technologies, there are no stable and simple methods for measuring in the major-axis directions by performing the above interference experiment because of its great dependency on an adjustment of a horizontal mode of the laser beam and an optical system. Also, in the case of the measurement in the major-axis directions by changing the direction of polarization of the incident laser beam, the measurement's sensitivity is not enough to detect a slight change to be caused by a function of the electrooptic effect in the major-axis directions. Accordingly, the most effective method for obtaining a reproductive and precise result of the measurement is the method including a seep of replacing the change in the optic major axes with the phase variation of light. Therefore, the method will be now described below.

Figure 2:
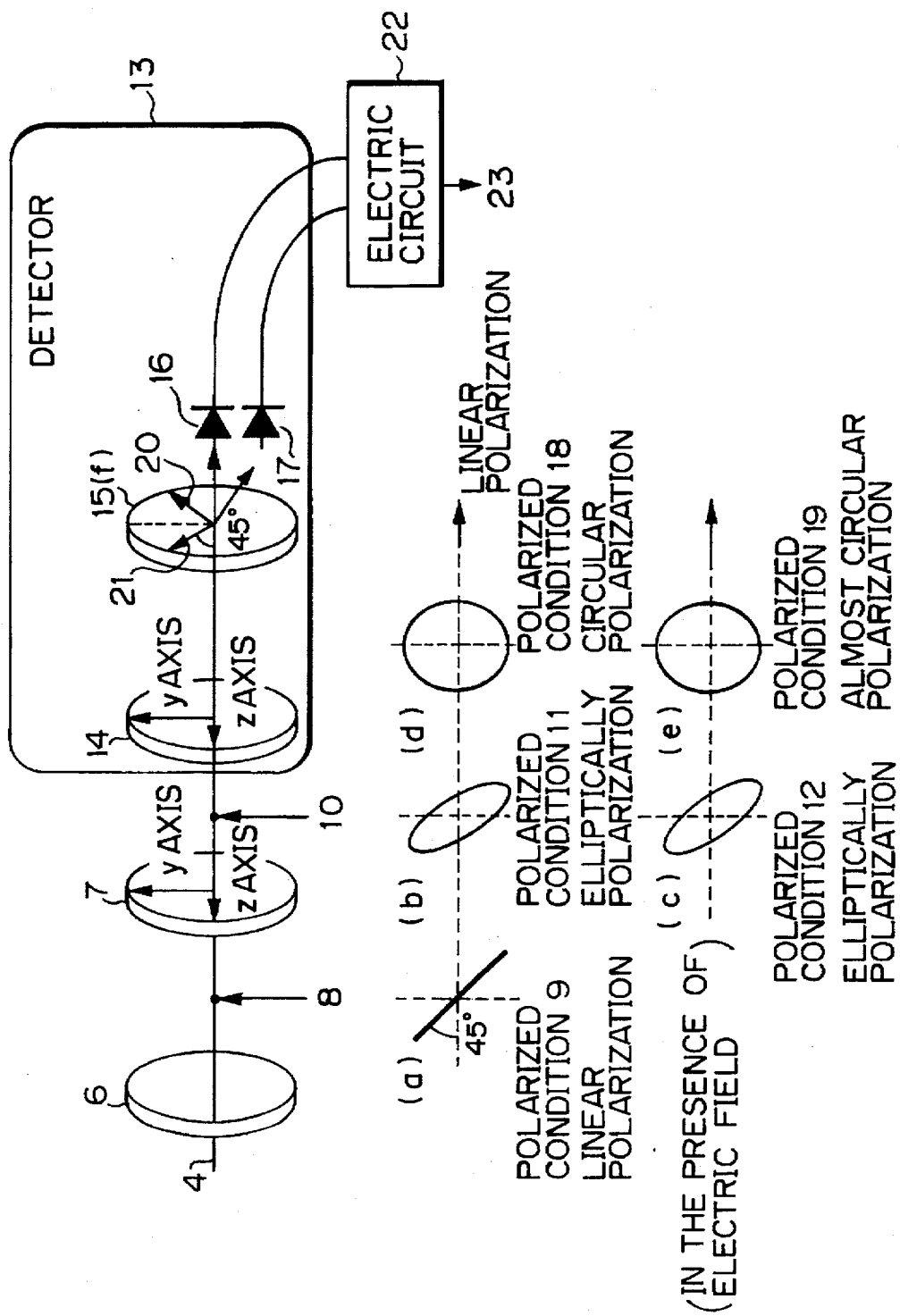
FIG. 2 is a schematic illustration of an arrangement of devices for explaining a basic construction for the conventional electrooptic sampling process with a view of polarized conditions of a laser beam propagating through the arrangement.

In this method, a laser beam is incident on an electrooptic crystal in %he direction along an x-axis thereof. A polarized condition of the laser beam is defined as a linear polarization having the polarized direction parallel to an axis y or z of the electrooptic crystal. When an electric field is not generated in the crystal, an output light from the crystal is also provided as a linear polarization because the polarized condition of the incident laser beam is coincident with the directions of the optic major axes that correspond to individual polarized directions of the electrooptic crystal. When the electric field is generated in the electrooptic crystal, the optic major axes of the crystal are changed from the axes y and z. Therefore, each major axis after the change is indicated by an axis y' or z'. In this case, furthermore, the incident light behaves as one with a result of slightly adding the polarized component of the z' axis on the polarized component of the y' axis. If the electrooptic crystal has a property of birefringence, refractive indexes of the axes y' and z' are different from each other. Thus a phase difference between these axes is generated and results in an elliptical polarization. The change in the optical major axes is proportionate to the above phase difference converted into an electrical signal as an output by means of a detector in the same type as that of used in the conventional measurement (see FIG. 2). The output electric signal is proportionate to one electric field components in the direction defined by a function of positioning the electrooptic crystal and the laser beam.

Figure 3:
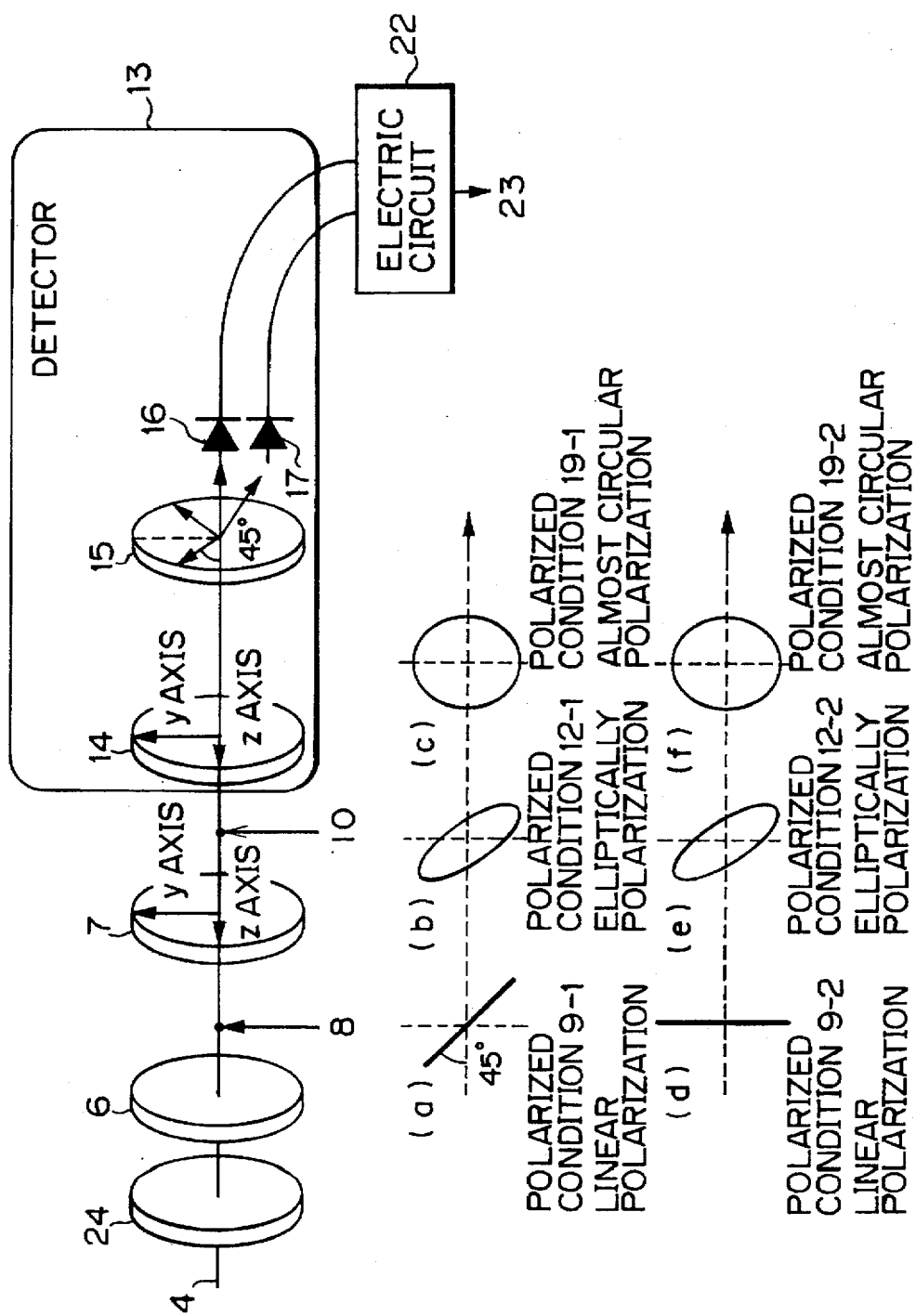
FIG. 3 is a schematic illustration of an arrangement of devices for explaining a basic construction for an electrooptic sampling process with a view of polarized conditions of a laser beam propagating through the arrangement in accordance with the present invention.

FIG. 3 shows an arrangement of devices for explaining a principle of the method of measuring an electric signal in accordance with the present invention. In this figure, an electrooptic crystal to be used is in the same type as that of the conventional one described above, without changing a pass of light.

In this embodiment, a half-wave plate 24 is inserted between an optical source 3 for emitting a laser beam 4 and a polarizer 6 in the arrangement for the conventional method for electrooptic sampling. The half-wave plate 24 is an element which can be revolved in that the laser beam 4 changes its mode of polarization. By adjusting a polarized direction of the polarizer 6 to a main polarized condition of light passing through the half-wave plate 24, a linearly polarized laser beam in an arbitrary direction can be realized with a small insertion-loss. By the way, it is also possible to change the direction of polarizing the laser beam 4 by revolving the polarizer 6 without using the half-wave plate 24. In this case, however, it is not adapted in a practical use. That is, there is a disadvantage in performing a high-sensitive measurement because of the change in intensity of the output light in conjunction with the change in the direction of polarization. In addition, if the change of the intensity of light cannot be detected precisely in each polarized direction, an extra precise measurement cannot be made.

When the polarized direction of the incident light is inclined at an angle of 45° with respect to the axes of x and y of the electrooptic crystal plate 7, as shown in (a) of FIG. 3, the resulting output is much the same as that of the conventional one in that it is proportionate to the change in the refractive index of the crystal plate 7. In this case, an output electric signal is provided as an overlap of the above electric field component corresponding to the change in the optic major axes and the electric field component perpendicular thereto.

On the other hand, when the incident light does not grouped in one of two polarized conditions in which one having the polarized direction parallel to the optic major axes and the other having the polarized direction deviated from the optic major axes at an angle of 45°, the electric output signal is provided as an overlap of the above electric field component corresponding to the change in the optic major axes and the electric field component perpendicular thereto. In this case, however, the ratio of these components is different from that of obtained by being incident at an angle of 45°.

Consequently, the electric field components of two directions, which are perpendicular to each other, can be obtained by performing an arithmetic operation of finding the difference between the outputs in which one proportionate to the change in the refractive index and another proportionate to the change in the direction of the optic major axes. That is, the electric field components of two directions perpendicular to each other can be obtained in one arithmetic operation after performing two measurement procedures: one is performed under the condition that the polarized condition of the incident light is parallel to the x axis; and another is performed under the condition that the polarized condition of the incident light is inclined at an angle of 45° with respect to the axes x and y. Alternatively, it is also possible to obtain the above components by using the polarized condition of the incident light which is parallel to the y axis in one measurement and using the polarized condition of the incident light which is inclined at an angle of 45° with respect to the axes x and y in another measurement to obtain the result in one arithmetic operation.

The electrooptic crystal to be used in the present invention should be characterized not only by changing its refractive index but also changing the direction of the optic major axes under the electric field applied on the crystal. In addition, to assure that the change in the direction of the optic major axes is proportionate to the optical outputs, the crystal should have a birefringent property thereof. Furthermore, it is also required that the direction of the incident laser beam is provided as the direction of the optic major axis of the optical indicatrix with respect to the ordinary ray thereof. It is noted that the high sensitive measurement can be performed on two outputs which are proportionate to the change in the reflective index and the direction of the optic major axes because of an existence of two largest electrooptic coefficients $r_{55}$ and $r_{33}$ in the $C_{3v}$-type electrooptic crystal used in the present invention. The crystal that satisfy these conditions is selected from $LiNbO_3$, $LiTaO_3$, and the like.

Hereinafter, we are now explaining a preferred embodiment of the present invention with reference to the drawings.

Figure 4:
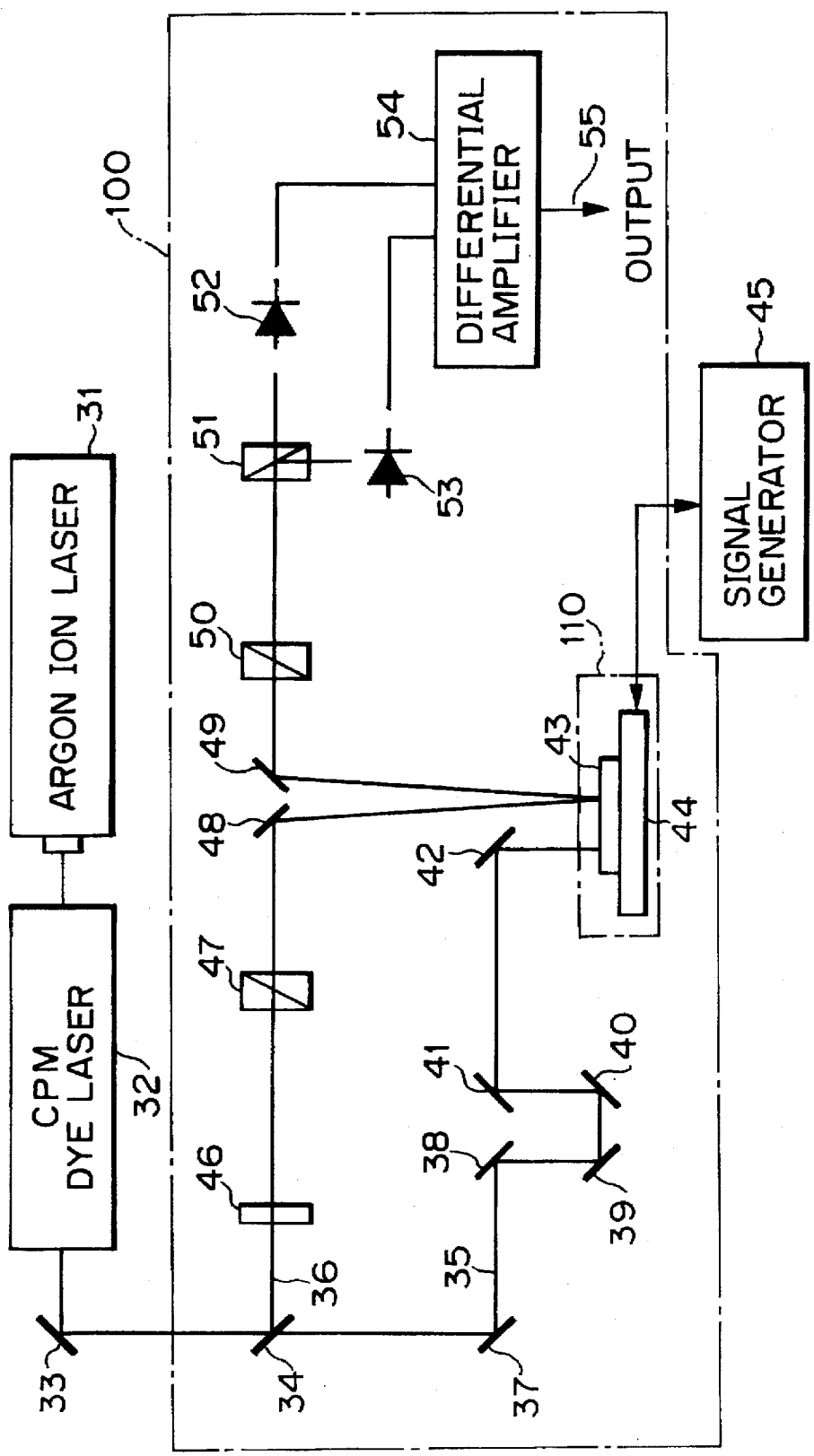
FIG. 4 is a schematic illustration of an optical pathway for explaining an arrangement of devices in an electrooptic sampling apparatus that enables the measurement of a plurality of electric field components in accordance with the present invention.

FIG. 4 illustrate an arrangement of devices in the preferred embodiment of the present invention. In the figure, laser devices used as optical sources are an argon laser 31 and a CPM (colliding pulse mode-locked) dye laser 32. The CPM dye laser 32 emits a pulse beam as an output with a repetitive frequency of about 100 Mhz, an average output of about 20 mW, a pulse width of 80 fs (femto-seconds), and a central wavelength of 620 nm.

A laser beam emitted from the CPM laser 32 is introduced into an electrooptic sampling portion 100 after turning its propagating direction by reflecting from a mirror 33. In the electrooptic sampling portion 100, the output beam of the dye laser 32 is resolved into two rays 35 and 36 at a ratio of 9 to 1 by passing through a beam splitter 34. The first ray 35 is used as an excitation ray for exciting an photoconductive switch in a measurement portion 110 after turning its propagating direction by reflecting from a mirror 37. On the other hand, the second ray 36 is used as a measurement ray for an electrooptic sampling after turning its propagating direction by reflecting from a mirror 34.

The above photoconductive switch is responsible to generate an electric pulse signal in an electric circuit under measurement 44, in which the electric pulse signal is synchronized with the measurement ray 36.

In FIG. 4, reference numerals 38–41 are movable mirrors for variably delaying the excitation ray 35 and reference numeral 45 denotes a signal generator.

A polarization mode of the measurement ray 36 is determined by a half-wave plate 46 prior to being adjusted to that mode by a polarizer 47. After passing through the polarizer 47, the ray 36 is incident on an electrooptic crystal plate 43. By passing through the crystal plate 43, the ray 36 is subjected to a phase modulation to change its polarization mode. An output of the electrooptic crystal plate 43 is introduced into a Soleil Babinet compensator 50 to compensate a phase of the laser beam. Subsequently, the ray 36 is incident on a birefringent prism 51 by which it is further dissolved into two rays of light with modified strength and received by optical receivers 52 and 53, respectively. The receivers 52, 53 are photoelectric conversion elements made of photodiodes.

Finally, each output of the photoreceivers 52 and 53 is amplified by a differential amplifier 54 and produced as an output in the form of an electric signal 55.

Figure 5:
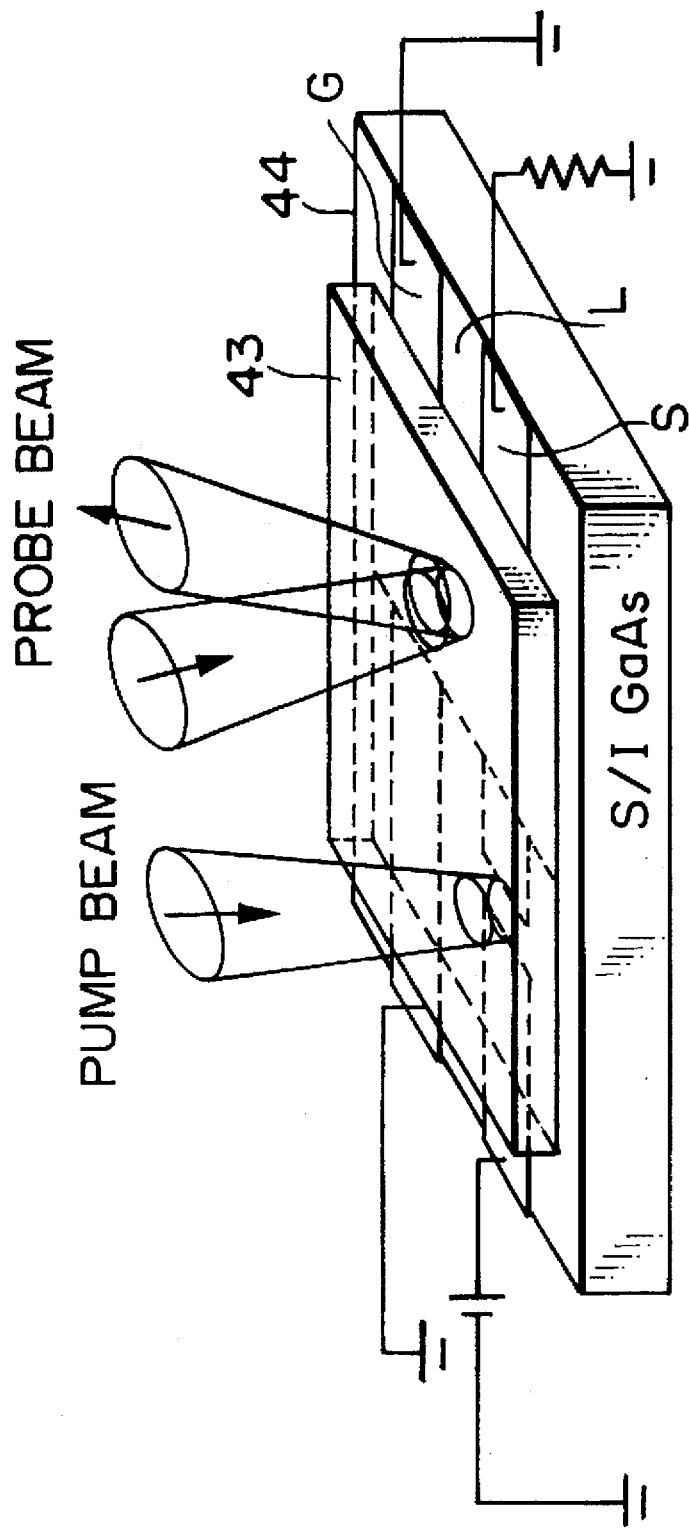
FIG. 5 is a perspective diagram of an electrooptic crystal on an electric circuit under measurement in accordance with the present invention.

FIG. 5 shows the above electric circuit 44 under measurement. The electric circuit 44 is prepared by integrating a coplanar-transmission line S made of two parallel metal electrodes and the photoconductive switch portion 47 formed by facing two metal electrodes 45, 46 on a semi-insulating GaAs substrate 44. Each metal electrode is formed by a vacuum deposition of gold with 200 nm in thickness. In the photoconductive switch portion 47, the metal electrodes 45, 46 are positioned in series with a gap length of 2 μm.

As shown in the figure, there are two stripe lines in which one is for signal transmission and the other is for ground line, with 20 μm in width. Also, a distance L between two parallel stripe lines S, G is in 20 μm. Furthermore the electrooptic crystal plate 43 is closely touched on the electric circuit 44 under measurement. In this embodiment, $LiTaO_3$ is used as the electrooptic crystal plate 43 that is arranged on the electric circuit 44, so that the optical principle axis x of the crystal plate 43 is perpendicular to a surface of the circuit 44. In this embodiment, also, half of the a back side of the crystal plate 43 has a reflective coating of dielectric films. In addition, a size of the crystal is 300 μm in length, 250 μm in width, and 50 μm in thickness.

Under the measurement, first of all, the measurement laser beam (hereinafter, also referred as a probe beam) 36 is incident on the electrooptic crystal plate 43 so as to have its polarized direction at an angle of 45° with respect to the optic major axes of the crystal plate 43. In this case, an electric field component in the propagating direction and an electric field component in the transverse direction generate electrooptic effects on the measurement of an electric signal propagating through the above stripe lines. Also, the crystal plate 43 is positioned so as to have a maximum sensitivity against the electric field component in the transverse direction. In this case, furthermore, a superposition between an effect of the electric field component in the propagating direction and an effect of the electric field component in the transverse direction is provided as an output of the measurement. The results are illustrated in FIG. 6.

Figure 7:
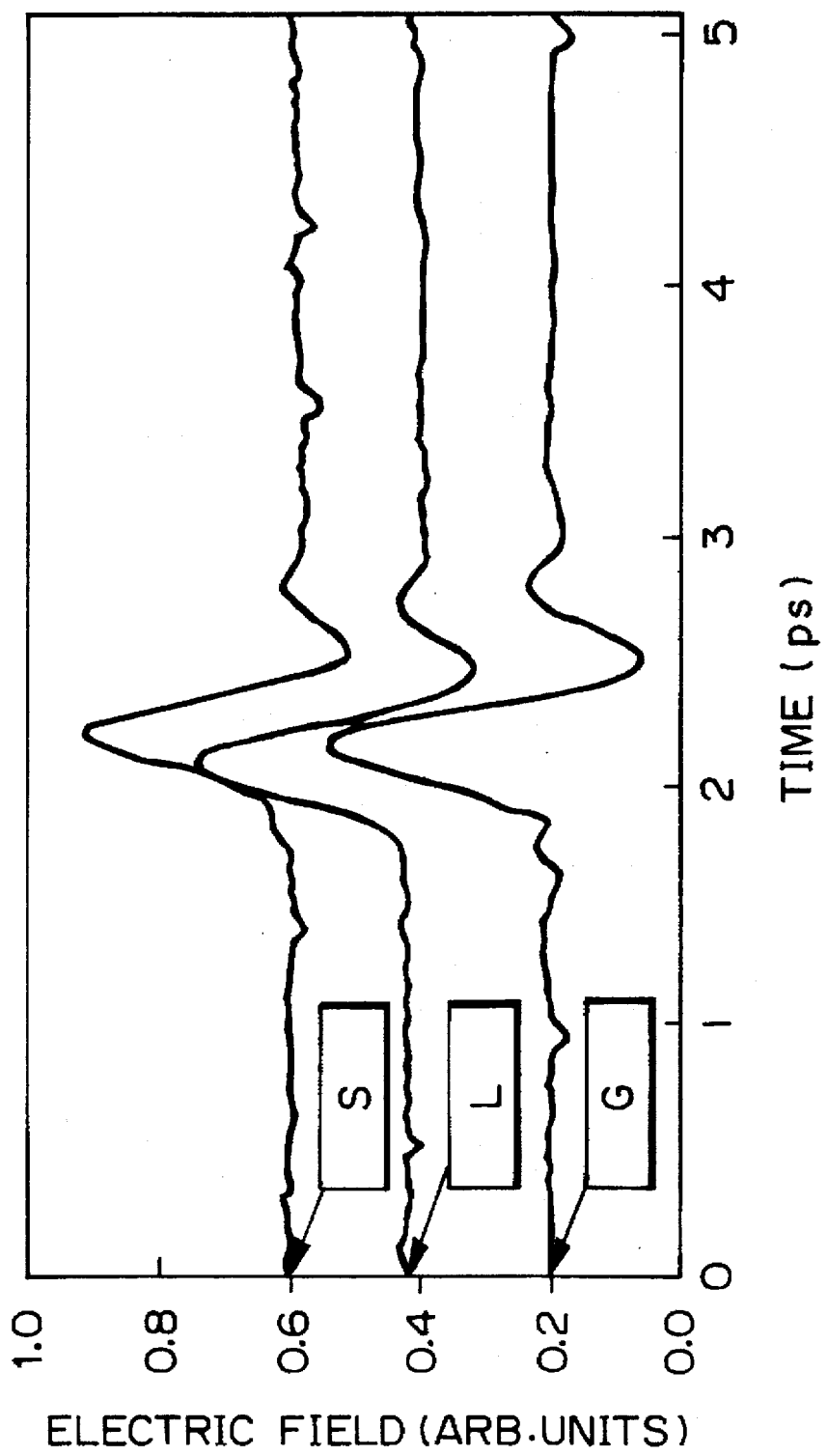
FIG. 7 is a graphical representation of the measurement results concerned with a photoconductive switch when a laser beam is incident on an electrooptic crystal in which a polarized condition of the laser beam is in the direction of an axis z.

In addition, in the case that the polarized direction of the measurement laser beam 36 is along the axial direction of the electrooptic crystal plate 43, the direction of the optical major axes can be changed in proportion to the electric field component in the propagating direction. Thus an output can be generated in proportion to the change in the optical major axes of the electrooptic crystal plate 43. The results are illustrated in FIG. 7. From the results of two measurement procedures, the electric field components in the propagating and traverse directions can be obtained.

Figure 6:
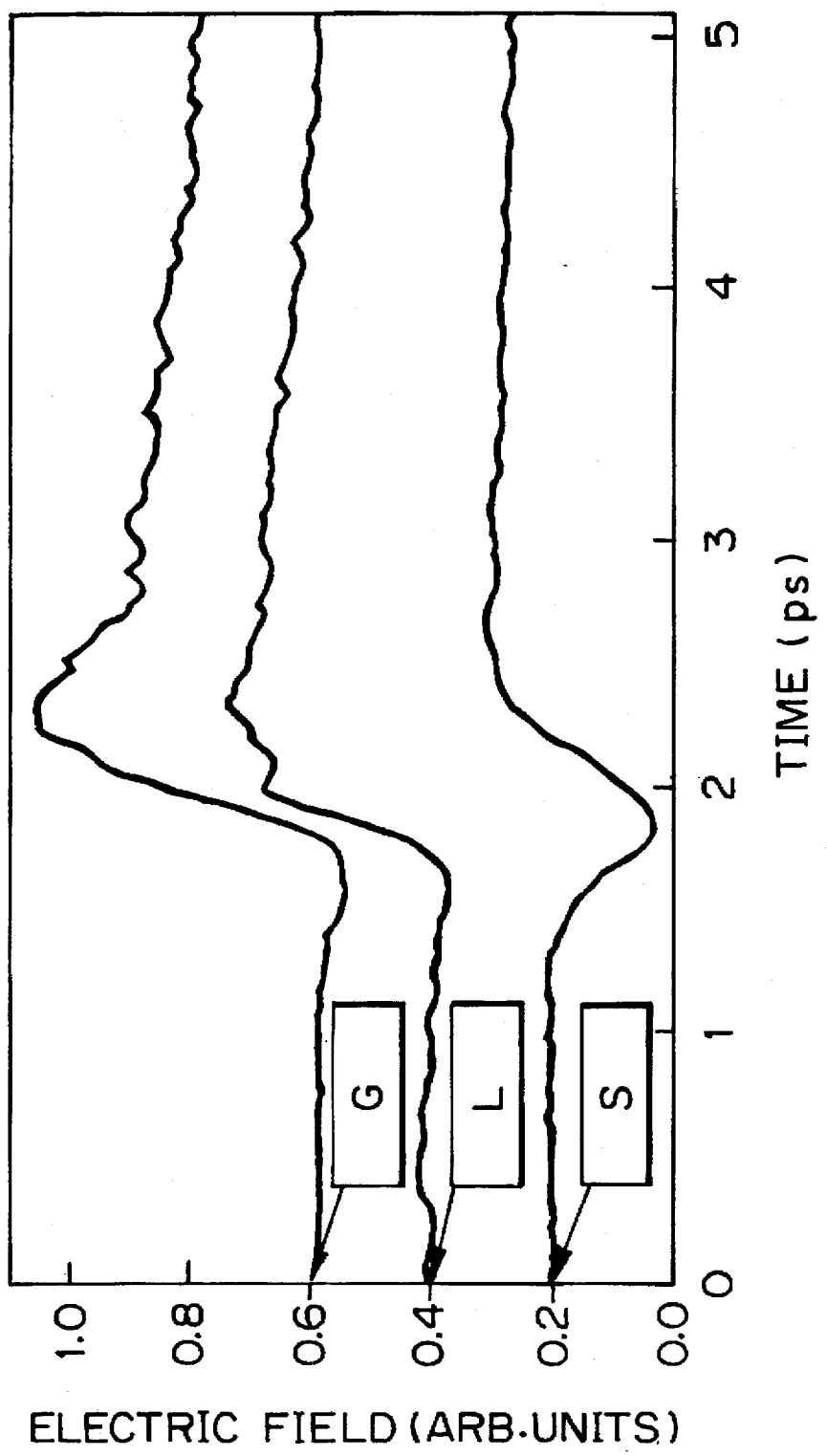
FIG. 6 is a graphical representation of the measurement results concerned with a photoconductive switch when a laser beam is incident on an electrooptic crystal in which a polarized condition of the laser beam is inclined at an angle of 45° with respect to the direction of an axis z.

FIG. 6 shows the results of the measurement when the sampling beam (i.e., the measurement laser beam) is incident on the electrooptic crystal (hereinafter also referred as EO probe) plate 43 under the condition that the sampling beam is polarized at an angle of 45° with respect to the crystalls axis. A measuring point is distant from the photoconductive switch by 150 μm. Magnitudes of the electric field applied on the crystal plate 43 are measured at three points, i.e., on the signal line S, the ground line G, and the space L between these lines S and G, respectively. In the measurement on the signal line S, a remarkable undershoot is generated. In addition, undershoot can be also observed in the measurements on other lines L and G. In this case, the undershoot may be caused by the phase-change with respect to the electric field component in the propagating direction by a function of the electrooptic coefficient $r_{22}$. A pulse rise time and a pulse width of the electric signal at the period of superposing the effect of the electric field component in the propagating direction over the electric field component in the transverse direction should be estimated without contribution of the former.

FIG. 7 shows results of the measurement when the sampling beam is incident on the electrooptic crystal plate 43 under the condition that the sampling beam is polarized along the crystal's axis. For obtaining a maximum sensitivity of the crystal plate 43, the half-wave plate 46 in front of the polarizer 47 is revolved so as to obtain a maximum output of the polarizer 47. In addition, Soleil Babinet compensator 50 is adjusted so that the crystal plate 43 has a maximum sensitivity against the electric field component in the propagating direction but not in the transverse direction. In this case, a measuring point is the same as the measuring point used at the time of introducing the incident light at an angle of 45° in FIG. 6. The resulting output waveform has a surge of electrical power in one direction and subsequent small peaks. Comparing a curved line of FIG. 7 with that of FIG. 6 with respect to time base, it is confirmed that the electric-filed in the propagating direction is remarkably appeared in a sudden risen portion of the pulse.

In FIG. 7, pulse width at the points of signal line S, ground line G, and space L therebetween are 300 fs, 400 fs, and 400 fs, respectively. Therefore, the pulse width at the point of the signal line S is shorter than that of other points. In addition, a dispersion of the peak electric field strength is less than 10%. Regarding to a peak time of the pulse, a peak time of the space L between lines S and G is earlier than that of others.

For measuring a precise pulse rise time, it is required that a component originated from the electric field component in the propagating direction is subtracted from the waveform obtained by the 45° incidence.

Figure 8:
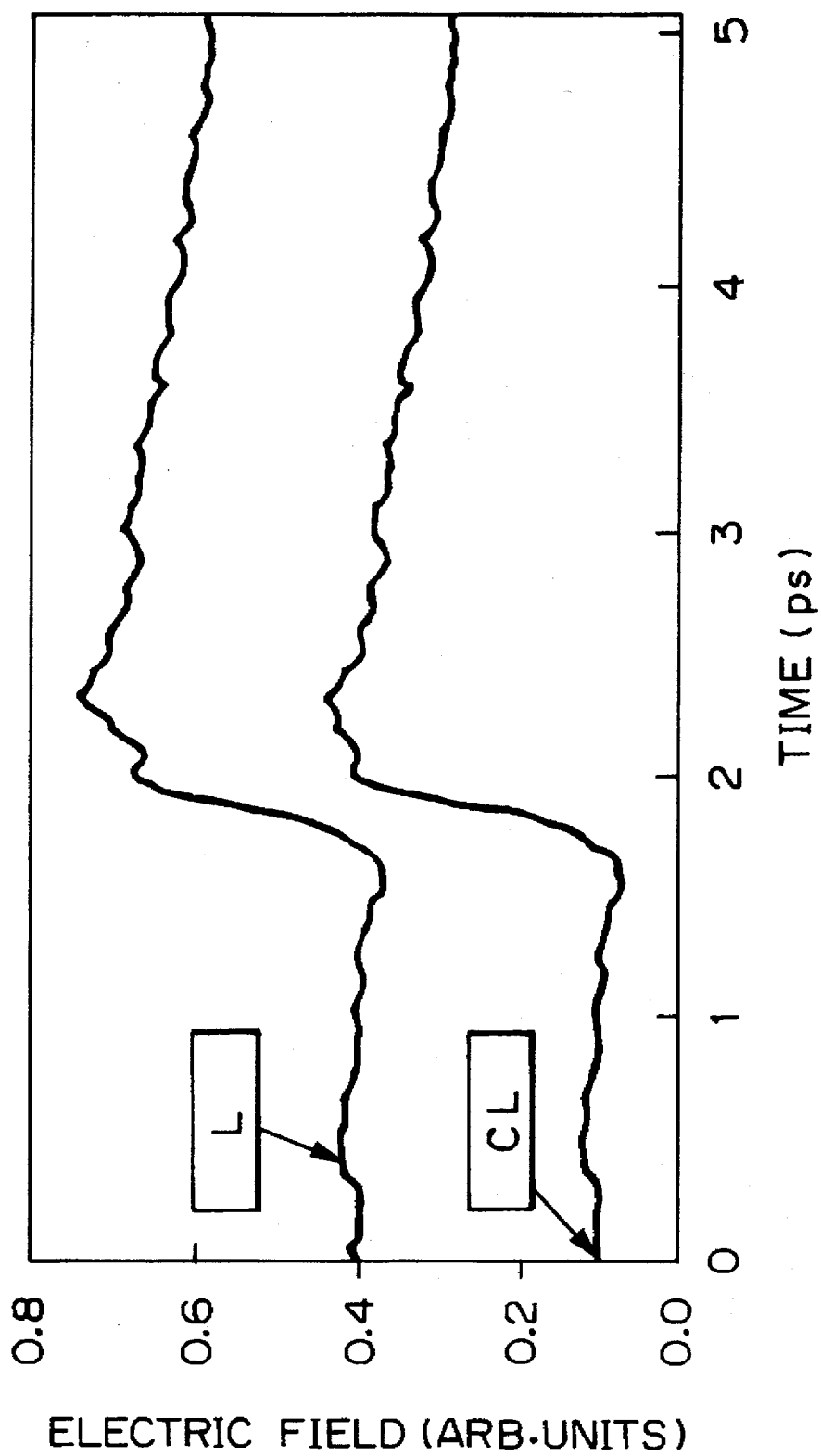
FIG. 8 is a graphical representation of results of an electric field component between signal and ground lines in a transverse direction in which the measurement error caused the electric field in a propagating direction is removed.

FIG. 8 shows the results of the measurement on the space L between the lines S and G and the compensated results thereof. The results without the compensation are of FIG. 6 and the electric field component for the compensation is of FIG. 7. As shown in FIG. 8, any ringings are not observed at the pulse rise portion. Before the compensation a 10–90% pulse rise time is 350 fs, while after the compensation the time is 300 fs.

As described above, in accordance with the above embodiment, by using the half-wave plate and the polarizer for changing the polarized condition of the incident laser beam, components of an electric-field's vector in a plurality of directions can be measured without mechanically shifting a position of the electrooptic crystal and without decreasing a reproductivity and a reliability of the measurement. In accordance with the present invention, therefore, the measurement results corresponding to those components can be obtained in spite that they cannot be obtained by the conventional methods. Only the present invention provides excellent degrees of time-resolution and precision to determine electric field components in any directions in a plane defined by components of electric-field's vector in a plurality of directions.

The present invention has been described in detail with respect to preferred embodiments, and it will now be that changes and modifications may be made without departing from invention in its broader aspects, and it is the intention, therefore, in the appended claims to cover all such changes and modifications as fall within the true spirit of the invention.

What is claimed is:

1. A method of electro-optical measurement for vector components of an electric field by a detection of a potential between two points in an electric circuit or an electric field generated by said electric circuit, in which variations in optical characteristics of an electrooptic crystal adjacent to said electric circuit are used for said detection, said method comprising steps of:

introducing an optical pulse having a predetermined polarized condition as an incident light into said electrooptic crystal in a direction parallel to one of optic major axes of said electrooptic crystal under a condition that an electric field is not applied on said electrooptic crystal;

modulating said predetermined polarized condition of said incident light into two different polarized conditions by passing said incident light through a half-wave plate and a polarizer without mechanically displacing said electrooptic crystal;

converting optical outputs from said electrooptic crystal into electric signals with respect to said two different polarized conditions, respectively;

measuring magnitudes of said electric signals, respectively; and determining two of three components of a vector of said electric field in said electrooptic crystal by performing an arithmetic operation on results of said measurement.

2. A method as claimed in claim 1, wherein said electrooptic crystal is in a type of changing a direction of said optic major axes in a presence of said electric field in said electrooptic crystal; and a direction of introducing said incident light into said electrooptic crystal is defined as a direction without corresponding to a rotation axis of an optical indicatrix, wherein said step of measuring magnitudes of said electric signals with respect to said two different polarized conditions, comprising sub-steps of:
 providing a polarized condition of said incident light as a linear polarization;
 modifying one of said two different polarized conditions into a polarized condition parallel to one of said optic major axes without said electric field in said electrooptic crystal; and
 measuring magnitudes of said electric signals under by using variations in said polarized condition of said incident light in a presence of said electric field in said electrooptic crystal.

3. A method as claimed in claim 1, wherein
said electrooptic crystal is in a type of causing a change in refractive indexes thereof by an electrooptic effect and changing a direction of said optic major axes by said electrooptic effect; and a direction of introducing said incident light into said electrooptic crystal is defined as a direction without corresponding to a optic axis of said electrooptic crystal wherein
 said step of measuring magnitudes of said electric signals with respect to said two different polarized conditions comprising sub-steps of:
  modifying one of said two different polarized conditions into a polarized condition parallel to one of said optic major axes without said electric field in said electrooptic crystal; and
  measuring magnitudes of said electric signals under by using variations in said polarized condition of said incident light in a presence of said electric field in said electrooptic crystal.

4. A method as claimed in claim 1, wherein said electrooptic crystal is made of a material which has two large electrooptic coefficients, in which one coefficient is a diagonal component and the other coefficient is a non-diagonal component.

5. An apparatus for electro-optical measurement for vector components of an electric field by a detection of a potential between two points in an electric circuit or an electric field generated by said electric circuit, in which variations in optical characteristics of an electrooptic crystal adjacent to said electric circuit are used for said detection, said apparatus comprising:
 a device for introducing an optical pulse having a predetermined polarized condition as an incident light into said electrooptic crystal in a direction parallel to one of optic major axes of said electrooptic crystal under a condition that an electric field is not applied on said electrooptic crystal;
 a device having a halfwave plate and a polarizer for modulating said predetermined polarized condition of said incident light into two different polarized conditions by passing said incident light without mechanically displacing said electrooptic crystal;
 a device for converting optical outputs from said electrooptic crystal into electric signals with respect to said two different polarized conditions, respectively;
 a device for measuring magnitudes of said electric signals, respectively; and
 a device for determining two of three components of a vector of said electric field in said electrooptic crystal by performing an arithmetic operation on outputs of said device for measuring magnitudes of said electric signals.

6. An apparatus as claimed in claim 5, wherein
said device for converting optical output from said electrooptic crystal into electric signals, having:
 a phase compensate plate for adjustably compensating a phase of an output light emitting from said electrooptic crystal under a phase modulation;
 a birefringent prism for converting a change of said phase of said output light into a change of strength thereof; and
 a photoelectric converter for performing a photoelectric conversion of an output light from said birefringent prism.

7. An apparatus as claimed 5, wherein said electrooptic crystal is made of a material which has two large electrooptic coefficients, in which one coefficient is a diagonal component and the other coefficient is a non-diagonal component.

8. An apparatus as claimed in claim 5, wherein
said device for modulating said predetermined polarized condition of said incident light performs two measurements: a first measurement where said incident light is incident on said electrooptic crystal under a condition of inclining said polarized direction of said incident light at an angle of 45° with respect to a crystal axis of said electrooptic crystal; and a second measurement where said incident light is incident on said electrooptic crystal under a condition that said polarized direction of said incident light is parallel to said crystal axis of said electrooptic crystal, and
 a device for determining two of three components of said vector of said electric field in said electrooptic crystal performs a compensation for obtaining a correct waveform of said electric signals for one of two components of a component originated from a component in a propagating direction of said electric field from a waveform obtained by introducing said incident light at the angle of 45° into said electrooptic crystal.

9. An apparatus as claimed in claim 8, wherein
said half-wave plate is adjusted so as to obtain a maximum output from said polarizer and said phase compensate plate is adjusted so as to obtain a maximum sensitivity of an output light therefrom against said component in said propagating direction of said electric field without any sensitivity thereof against components in a traverse direction of said electric field.

10. A method as claimed in claim 4, wherein said electrooptic crystal is $C_{3v}$-type crystals.

11. A method as claimed in claim 10, wherein said $C_{3v}$-type electrooptic crystal is selected from the group consisting of $LiNbO_3$ and $LiTaO_3$.

12. An apparatus as claimed in claim 7, wherein said electrooptic crystal is $C_{3v}$-type crystals.

13. An apparatus as claimed in claim 12, wherein said $C_{3v}$-type electrooptic crystal is selected from the group consisting of $LiNbO_3$ and $LiTaO_3$.

* * * * *

UNITED STATES PATENT AND TRADEMARK OFFICE
CERTIFICATE OF CORRECTION

PATENT NO. : 5,737,082
DATED : April 7, 1998
INVENTOR(S) : Taro Itatani, Tadashi Nakagawa, Yoshinobu Sugiyama and Kimihiro Ohta It is certified that error appears in the above-indentified patent and that said Letters Patent is hereby corrected as shown below:

On the title page,
Assignee [73], please delete
"NTT Mobile Communications Network, Inc., Japan"
and replace with --Agency of Industrial Science
and Technology, Japan--.

Signed and Sealed this

Second Day of February, 1999

Attest:

Attesting Officer

*Acting Commissioner of Patents and Trademarks*